United States Patent
Seok et al.

(10) Patent No.: US 11,908,535 B2
(45) Date of Patent: Feb. 20, 2024

(54) MEMORY DEVICE AND MEMORY CONTROLLER AND STORAGE DEVICE INCLUDING THE MEMORY DEVICE AND MEMORY CONTROLLER

(71) Applicant: SAMSUNG ELECTRONICS CO., LTD., Suwon-si (KR)

(72) Inventors: Jinmin Seok, Suwon-si (KR); Jonghwa Kim, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 54 days.

(21) Appl. No.: 17/540,535

(22) Filed: Dec. 2, 2021

(65) Prior Publication Data
US 2022/0208296 A1 Jun. 30, 2022

(30) Foreign Application Priority Data
Dec. 29, 2020 (KR) .................. 10-2020-0186779

(51) Int. Cl.
*G11C 29/44* (2006.01)
*G11C 11/56* (2006.01)
(Continued)

(52) U.S. Cl.
CPC ...... *G11C 29/4401* (2013.01); *G11C 11/5671* (2013.01); *G11C 16/0483* (2013.01); *G11C 16/10* (2013.01)

(58) Field of Classification Search
None
See application file for complete search history.

(56) References Cited

U.S. PATENT DOCUMENTS 5,668,763 A * 9/1997 Fujioka ............... G11C 29/808
365/225.7
6,809,973 B2 10/2004 Lee
(Continued)

FOREIGN PATENT DOCUMENTS

CN 105895164 3/2019
DE 102018106111 A1 * 12/2018 ......... G11C 11/5621
(Continued)

OTHER PUBLICATIONS

Lee et al., "Design of a redundancy control circuit for 1T-SRAM repair using electrical fuse programming", Journal of the Korea Institute of Information and Communication Engineering 14(8), 1877-1885 (9 pages), Aug. 1, 2010.
(Continued)

*Primary Examiner* — Guerrier Merant
(74) *Attorney, Agent, or Firm* — F. CHAU & ASSOCIATES, LLC

(57) ABSTRACT

Provided are a memory device and a memory controller, which are configured to repair a weak word line, and a method of operating a storage device including the memory device and the memory controller. A memory device includes a memory cell array including a plurality of normal word lines and at least one spare word line, and a repair controller configured to set memory cells connected to at least one weak word line to a first operation mode and further configured to set memory cells connected to the at least one spare word line to a second operation mode. The at least one weak word line is detected from among the normal word lines based on a test result.

18 Claims, 18 Drawing Sheets

(51) Int. Cl.
    *G11C 16/10*   (2006.01)
    *G11C 16/04*   (2006.01)

(56) References Cited

U.S. PATENT DOCUMENTS

| | | |
|---|---|---|
| 6,856,561 B2 | 2/2005 | Kato et al. |
| 8,315,097 B2 | 11/2012 | Hishida et al. |
| 8,498,153 B2 | 7/2013 | Seong |
| 9,293,227 B1 | 3/2016 | Takasugi |
| 9,455,048 B2 * | 9/2016 | Berckmann ........ G11C 16/0483 |
| 9,472,286 B2 | 10/2016 | Chen |
| 2004/0001375 A1 * | 1/2004 | Beer ................ G11C 29/36 |
| | | 365/200 |
| 2013/0262740 A1 * | 10/2013 | Kim ................ G11C 29/24 |
| | | 711/102 |
| 2014/0140162 A1 * | 5/2014 | Kim ................ G11C 16/20 |
| | | 365/230.01 |

FOREIGN PATENT DOCUMENTS

| | | | |
|---|---|---|---|
| KR | 10-2076584 | 2/2020 | |
| WO | WO-2014209624 A1 * | 12/2014 | ......... G11C 16/0483 |

OTHER PUBLICATIONS

Han et al. "On the Repair of Memory Cells with Spare Rows and Columns for Yield Improvement", 2004 Jeju International Simulation Multiconference Part II, 817-826 (10 pages), Oct. 1, 2016.

* cited by examiner

300a

| | CELL OPERATION MODE |
|---|---|
| NWL6 | TLC |
| NWL5 | TLC |
| NWL4 | TLC |
| NWL3 | TLC |
| NWL2 | TLC |
| NWL1 | TLC |
| SWL3 | – |
| SWL2 | – |
| SWL1 | – |

300b

| | CELL OPERATION MODE |
|---|---|
| NWL6 | TLC |
| NWL5 | TLC |
| NWL4 | TLC |
| NWL3 | SLC |
| NWL2 | TLC |
| NWL1 | TLC |
| SWL3 | – |
| SWL2 | – |
| SWL1 | MLC |

FIG. 12

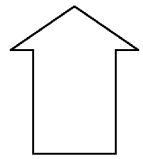

421a

| | BL1 | BL2 | BL3 | BL4 |
|---|---|---|---|---|
| NWL6 | NORMAL | NORMAL | NORMAL | NORMAL |
| NWL5 | NORMAL | NORMAL | NORMAL | NORMAL |
| NWL4 | NORMAL | NORMAL | NORMAL | NORMAL |
| NWL3 | NORMAL | NORMAL | NORMAL | NORMAL |
| NWL2 | NORMAL | NORMAL | NORMAL | NORMAL |
| NWL1 | NORMAL | NORMAL | NORMAL | NORMAL |
| SWL3 | - | - | - | - |
| SWL2 | - | - | - | - |
| SWL1 | - | - | - | - |

421b

| | BL1 | BL2 | BL3 | BL4 |
|---|---|---|---|---|
| NWL6 | NORMAL | NORMAL | NORMAL | NORMAL |
| NWL5 | NORMAL | FAIL | NORMAL | NORMAL |
| NWL4 | NORMAL | NORMAL | NORMAL | NORMAL |
| NWL3 | FAIL | NORMAL | NORMAL | FAIL |
| NWL2 | NORMAL | NORMAL | NORMAL | NORMAL |
| NWL1 | NORMAL | NORMAL | NORMAL | FAIL |
| SWL3 | - | - | - | - |
| SWL2 | - | - | - | - |
| SWL1 | - | - | - | - |

422a

| | LOGICAL ADDRESS | PHYSICAL ADDRESS | OPERATION MODE |
|---|---|---|---|
| NWL6 | LAN6 | PAN6 | TLC |
| NWL5 | LAN5 | PAN5 | TLC |
| NWL4 | LAN4 | PAN4 | TLC |
| NWL3 | LAN3 | PAN3 | TLC |
| NWL2 | LAN2 | PAN2 | TLC |
| NWL1 | LAN1 | PAN1 | TLC |
| SWL3 | – | PAS3 | – |
| SWL2 | – | PAS2 | – |
| SWL1 | – | PAS1 | – |

422b

| | LOGICAL ADDRESS | PHYSICAL ADDRESS | OPERATION MODE |
|---|---|---|---|
| NWL6 | LAN6 | PAN6 | TLC |
| NWL5 | LAN5 | PAN5 | TLC |
| NWL4 | LAN4 | PAN4 | TLC |
| NWL3 | LAN3 | PAN3 | SLC |
| NWL2 | LAN2 | PAN2 | TLC |
| NWL1 | LAN1 | PAN1 | TLC |
| SWL3 | – | PAS3 | – |
| SWL2 | – | PAS2 | – |
| SWL1 | LAS1 | PAS1 | MLC |

MEMORY DEVICE AND MEMORY CONTROLLER AND STORAGE DEVICE INCLUDING THE MEMORY DEVICE AND MEMORY CONTROLLER

CROSS-REFERENCE TO RELATED APPLICATION

This application claims priority under 35 U.S.C. § 119 to Korean Patent Application No. 10-2020-0186779, filed on Dec. 29, 2020, in the Korean Intellectual Property Office, the disclosure of which is incorporated by reference herein in its entirety.

TECHNICAL FIELD

The inventive concept relates to a memory controller, and more particularly to a memory device and a memory controller which are configured to repair a weak word line, and a storage device including the memory device and the memory controller.

DISCUSSION OF THE RELATED ART

Electronic devices, such as phones, tablets, personal computers, and others, often require built-in means to store data. For example, electronic devices may contain memory devices that include memory cells for the purpose of storing data. In some cases, the circuitry within the memory device may have one or more failures, preventing the use of one or more memory cells within the memory device. Conventional fabrication methods for memory devices may detect these failures and discard the dead cells.

A test operation for detecting a weak memory cell may be performed on a memory cell array of a memory chip. When the memory chip is discarded every time the weak memory cell is detected, there may be a large decrease in fabrication yield. In a repair operation, the weak memory cell may be replaced with an extra memory cell already included in the memory cell array during manufacturing. For example, the repair operation may be performed in units of memory blocks.

When the repair operation is performed in the units of memory blocks, a memory block including the weak memory cell may be discarded instead of using an extra memory block. In this case, even when the number of weak memory cells is excessively large or the weak memory cells concentrate in a specific portion, replacing all memory blocks including the weak memory cells may cause inefficiency.

SUMMARY

Embodiments according to the present disclosure include a memory device and a memory controller, which may utilize a weak word line, that would otherwise be discarded, in a repair operation, and a method of operating a storage device including the memory device and the memory controller.

A memory device according to an aspect of the present disclosure includes a memory cell array including a plurality of normal word lines and at least one spare word line, and a repair controller configured to set memory cells connected to at least one weak word line to a first operation mode and to set memory cells connected to the at least one spare word line to a second operation mode. The at least one weak word line is detected from among the normal word lines based on a test result.

A memory controller according to an aspect of the present disclosure is connected to a memory device including a plurality of normal word lines and at least one spare word line. The memory controller transmits a command to the memory device, detects at least one of the normal word lines as a weak word line based on whether an operation performed in response to the command fails, sets memory cells connected to the weak word line to a first operation mode, and sets memory cells connected to the at least one spare word line to a second operation mode.

A method of operating a storage device including a memory device and a memory controller according to an aspect of the present disclosure, where the memory device includes a plurality of normal word lines and at least one spare word line, includes: detecting at least one of the normal word lines as a weak word line, setting an operation mode of memory cells connected to the weak word line to a first operation mode and setting an operation mode of memory cells connected to the at least one spare word line to a second operation mode, receiving a write request from a host, and writing data to at least one of the memory cells connected to the weak word line and the memory cells connected to the at least one spare word line, based on the set operation mode.

BRIEF DESCRIPTION OF THE DRAWINGS

Embodiments of the inventive concept will be more clearly understood from the following detailed description taken in conjunction with the accompanying drawings, in which:

FIG. 12 is a table for explaining weak memory cell information according to an example embodiment;

DETAILED DESCRIPTION OF THE EMBODIMENTS

Figure 1:
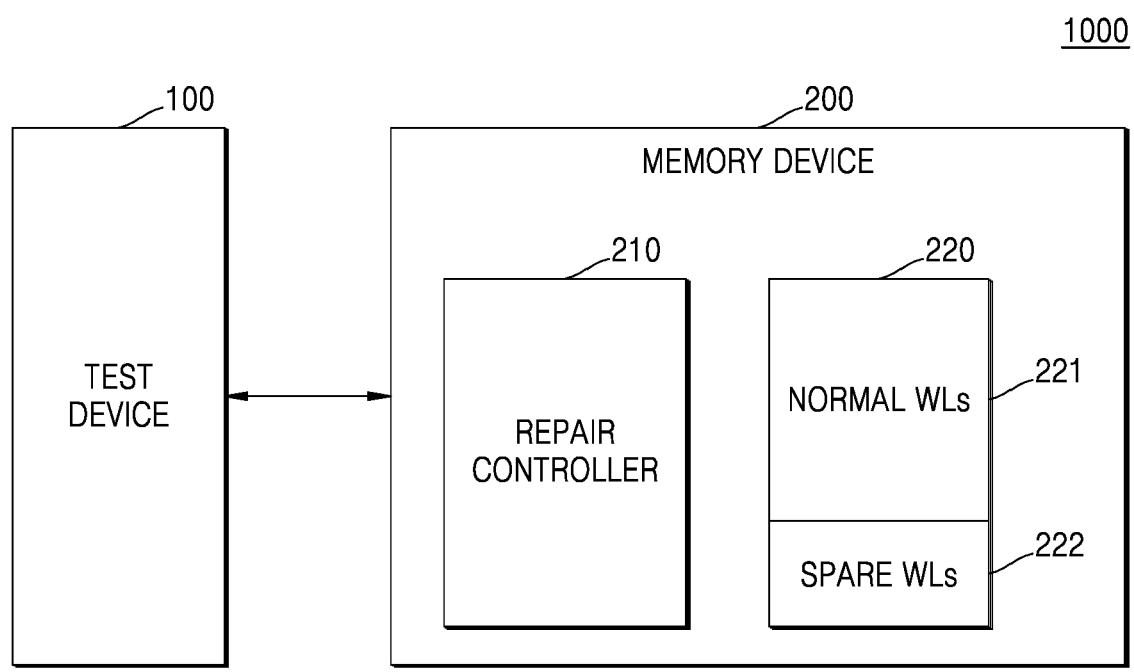
FIG. 1 is a block diagram of a test system according to an example embodiment.

Hereinafter, embodiments will be described in detail with reference to the accompanying drawings. Like reference symbols in the drawings may denote like elements, and to the extent that a description of an element has been omitted, it may be understood that the element is at least similar to corresponding elements that are described elsewhere in the specification.

FIG. 1 is a block diagram of a test system 1000 according to an example embodiment.

Referring to FIG. 1, the test system 1000 may include a test device 100 and a memory device 200. The memory device 200 may include a repair controller 210 and a memory cell array 220. In this example, the memory device 200 may be referred to as a device under test (DUT).

The test device 100 may test the memory device 200 corresponding to any one of: a wafer, a die, or a package. The test device 100 may transmit a command for performing a test operation to the memory device 200. In the present embodiment, the test operation may refer to a series of operations for detecting a weak memory cell of the memory cell array 220, without being necessarily limited thereto. In this embodiment, the test device 100 may transmit test data and test mode register set (TMRS) information to the memory device 200. The TMRS information may include several control signals for setting an operation mode of the memory device 200 to a test mode.

The memory device 200 may perform the test operation in response to the command received from the test device 100. For example, the memory device 200 may receive a write command or an erase command from the test device 100 and detect memory cells that have failed a write operation or an erase operation. Hereinafter, a memory cell that has failed a test operation will be referred to as a weak memory cell. As an example, a memory cell, which has failed the write operation in response to the write command, or a memory cell, which has failed the erase operation in response to the erase command, may be referred to as a weak memory cell.

The memory cell array 220 may include a plurality of memory cells. For example, the plurality of memory cells may be flash memory cells. Hereinafter, example embodiments in which the plurality of memory cells are NAND flash memory cells will be described. The memory cell array 220 may include a three-dimensional (3D) memory cell array including a plurality of NAND strings as will be described below with reference to FIG. 3.

The 3D memory cell array according to an embodiment is monolithically formed. The term "monolithic" may mean that layers of each level of the 3D memory cell array are directly deposited on the layers of each underlying level of the 3D memory cell array. For example, the 3D memory cell array may have at least one physical level of memory cell arrays having an active region provided above a silicon substrate, and a circuit associated with the operation of memory cells, wherein the circuit may be above or within the silicon substrate. In an embodiment, the 3D memory cell array may include NAND strings in which at least one memory cell is located on another memory cell in a vertical direction. The at least one memory cell may include a charge trap layer. The following patent documents, which are hereby incorporated by reference in their entirety, disclose suitable configurations for 3D memory arrays, in which the 3D memory array is configured at a plurality of levels, with word lines and/or bit lines shared between levels: U.S. Pat. Nos. 7,679,133; 8,553,466; 8,654,587; 8,559,235; and U.S. Pat. Pub. No. 2011/0233648.

The memory cell array 220 may include a plurality of memory cells connected to a plurality of word lines. The plurality of word lines may include normal word lines 221 and spare word lines 222 connected to a plurality of redundancy memory cells. As used herein, a redundancy memory cell may also be referred to as a spare memory cell.

A failure may occur in at least one memory cell of a plurality of memory cells connected to the normal word lines 221. Each memory cell of the plurality of memory cells may be classified as a weak memory cell or a normal memory cell according to a level of deterioration. A weak memory cell may mean a memory cell with low reliability due to deterioration. Hereinafter, a word line connected to a weak memory cell may be referred to as a weak word line. The weak word line 221 connected to a weak memory cell may be supplemented with or replaced by the spare word line 222. This process may be referred to as a repair operation.

The repair controller 210 may perform the repair operation as described above. To supplement the function of a weak memory cell detected via the test operation, the repair controller 210 may perform a series of operations to enable access to an extra spare memory cell. In an embodiment, the repair controller 210 may confirm position information about a weak word line, and confirm position information about the spare word line 222, which is required to operate the weak word line.

The repair controller 210 may set a cell operation mode of a memory cell when data is written to the memory cell. The cell operation mode of each memory cell of the memory cell array 220 may correspond to the number of bits written to the memory cell. For example, the cell operation mode may include any one of a single-level cell (SLC) mode for storing 1-bit data, a multi-level cell (MLC) mode for storing 2-bit data, a triple-level cell (TLC) mode for storing 3-bit data, a quad-level cell (QLC) mode for storing 4-bit data, and/or a mode for storing 5 bits or more.

Moreover, the cell operation mode may be different for each memory cell. For example, a memory cell in a wafer state may be set to a first operation mode. After the test operation, the repair controller 210 may set a cell operation mode of memory cells connected to the weak word line to a second operation mode when the cell is undergoing the repair operation, and set a cell operation mode of memory cells connected to the spare word line 222 to a third operation mode. For example, the first operation mode may be a mode in which n-bit data (where n is a natural number) is stored in a memory cell, the second operation mode may be a mode in which m-bit data (m is a natural number, m<n) is stored in a memory cell, and the third operation mode may be a mode in which (n-m)-bit data is stored in a memory cell. For example, the first operation mode may be a TLC mode, the second operation mode may be an SLC mode, and the third operation mode may be an MLC mode.

According to an embodiment, the repair controller 210 may not discard the weak word line, but rather set the weak word line to another cell operation mode to enable operations of the memory cell, thereby increasing the utilization of the memory cell, and thereby increasing the yield of the memory device when applied to many weak word lines.

Figure 2:
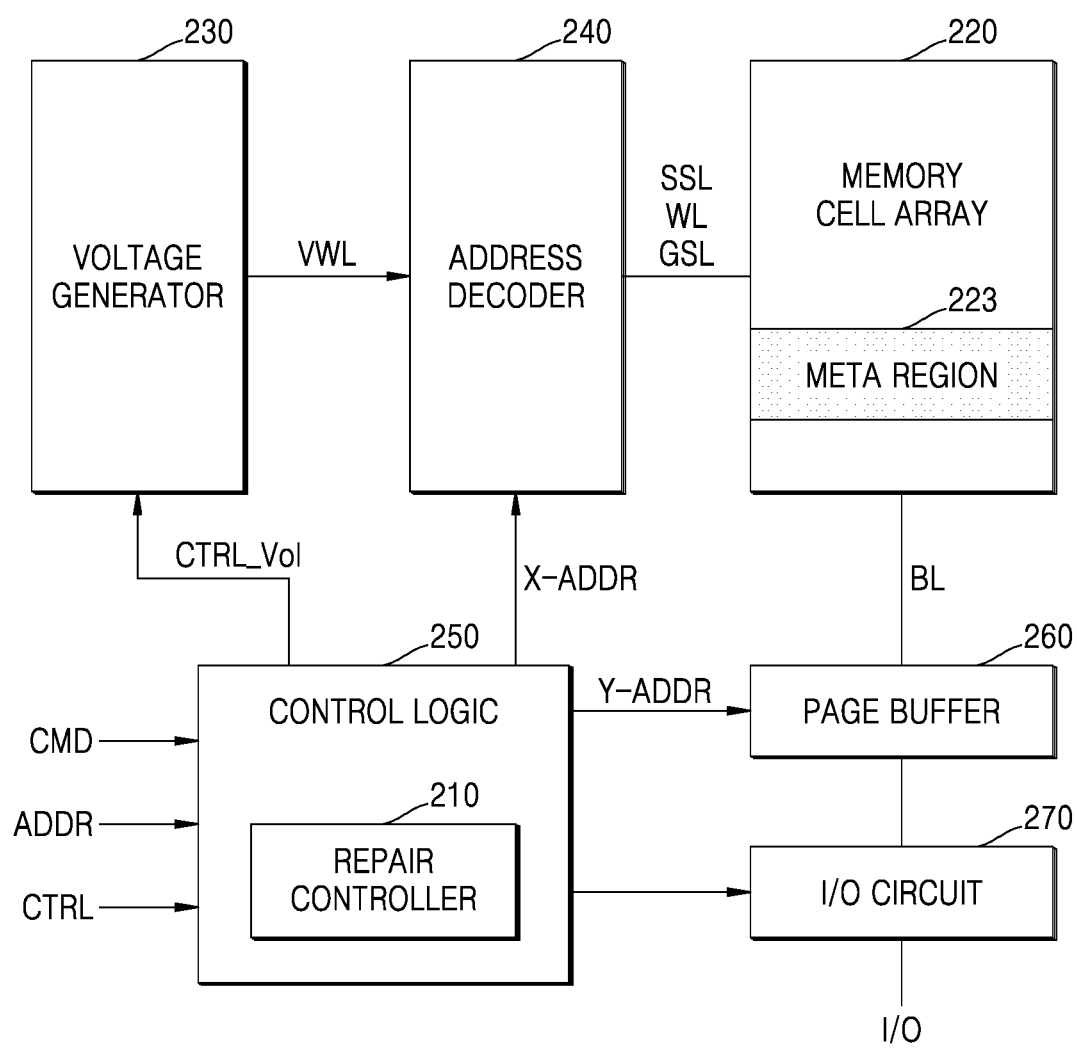
FIG. 2 is a block diagram of a memory device according to an example embodiment.

FIG. 2 is a block diagram of a non-volatile memory device 200 according to an example embodiment.

Referring to FIG. 2, the non-volatile memory device 200 may include a memory cell array 220, a voltage generator 230, an address decoder 240, a control logic 250, a page buffer 260, and an input/output (I/O) circuit 270. The non-volatile memory device 200 may further include an I/O interface, for example, a SATA interface.

The memory cell array 220 may be connected to word lines WL, string selection lines SSL, ground selection lines GSL, and bit lines BL. The memory cell array 220 may be connected to the address decoder 240 through the word lines WL, the string selection lines SSL, and the ground selection lines GSL, and connected to the page buffer 260 through the bit lines BL. The memory cell array 220 may include a plurality of memory blocks.

Each of the memory blocks may include a plurality of memory cells and a plurality of selection transistors. The memory cells may be connected to the word lines WL, and the selection transistors may be connected to the string selection lines SSL or the ground selection lines GSL.

A meta region 223 of the memory cell array 220 may include information about one or more weak memory cells, weak word lines, and spare word lines. These pieces of information may be generated by a repair controller 210, and the repair controller 210 may perform a repair operation based on the pieces of information described above. The meta region 223 may include memory cells connected to a normal word line of the memory cell array 220.

The voltage generator 230 may generate various voltages for performing a write operation, a read operation, and an erase operation on the memory cell array 220, based on a voltage control signal CTRL_vol. Specifically, the voltage generator 230 may generate a word line voltage VWL, for example, a program (write) voltage, a read voltage, a pass voltage, an erase verification voltage, and/or a program (write) verification voltage. In addition, the voltage generator 230 may generate a string selection line voltage and a ground selection line voltage, based on the voltage control signal CTRL_Vol. Furthermore, the voltage generator 230 may generate an erase voltage to be provided to the memory cell array 220.

The address decoder 240 may select one memory block of the plurality of memory blocks of the memory cell array 220, select one of word lines WL of the selected memory block, and select one string selection line of a plurality of string selection lines SSL.

The control logic 250 may output various control signals for performing write, read, and erase operations on the memory cell array 220, based on a command CMD, an address ADDR, and a control signal CTRL. The control logic 250 may provide a row address X-ADDR to the address decoder 240, provide a column address Y-ADDR to the page buffer 260, and provide the voltage control signal CTRL_Vol to the voltage generator 230.

The control logic 250 may include the repair controller 210. The repair controller 210 may detect the weak memory cell in the memory cell array 220, based on the command CMD, the address ADDR, and the control signal CTRL for a test operation, which are received from the test device 100 of FIG. 1. Position information about the weak memory cell may be stored in the meta region 223 of the memory cell array 220.

The repair controller 210 may determine the weak word line according to a set criterion, based on the information about the weak memory cell, and store the information about the weak word line in the meta region 223.

A unit of a failure detected via the test operation may not be limited to a unit of a memory cell and may be, for example, a unit of a memory block. In this case, the repair controller 210 may determine the weak word line based on information about a defective memory block.

The repair controller 210 may activate at least one spare word line to supplement the weak word line. Accordingly, the repair controller 210 may generate the voltage control signal CTRL_Vol for performing write, read, and erase operations on memory cells connected to the spare word line and provide the voltage control signal CTRL_Vol to the voltage generator 230. In addition, the repair controller 210 may provide the row address X-ADDR for performing the write, read, and erase operations on the memory cells connected to the spare word line to the address decoder 240, and provide the column address Y-ADDR to the page buffer 260.

The page buffer 260 may operate as a write driver or a sense amplifier according to an operation mode. During the read operation, the page buffer 260 may sense the bit line BL of a memory cell selected via the control of the control logic 250. Sensed data may be stored in latches included in the page buffer 260. The page buffer 260 may dump the data stored in the latches to the I/O circuit 270 via the control of the control logic 250.

The I/O circuit 270 may temporarily store the command CMD, the address ADDR, the control signal CTRL, and data DATA, which are provided to the non-volatile memory device 200 through an I/O line I/O. The I/O line I/O may connect the nonvolatile memory device to the outside; for example, to an external device. The I/O circuit 270 may temporarily store data read from the non-volatile memory device 200 and output the read data to the outside through the I/O line I/O at a designated time point.

Figure 3:
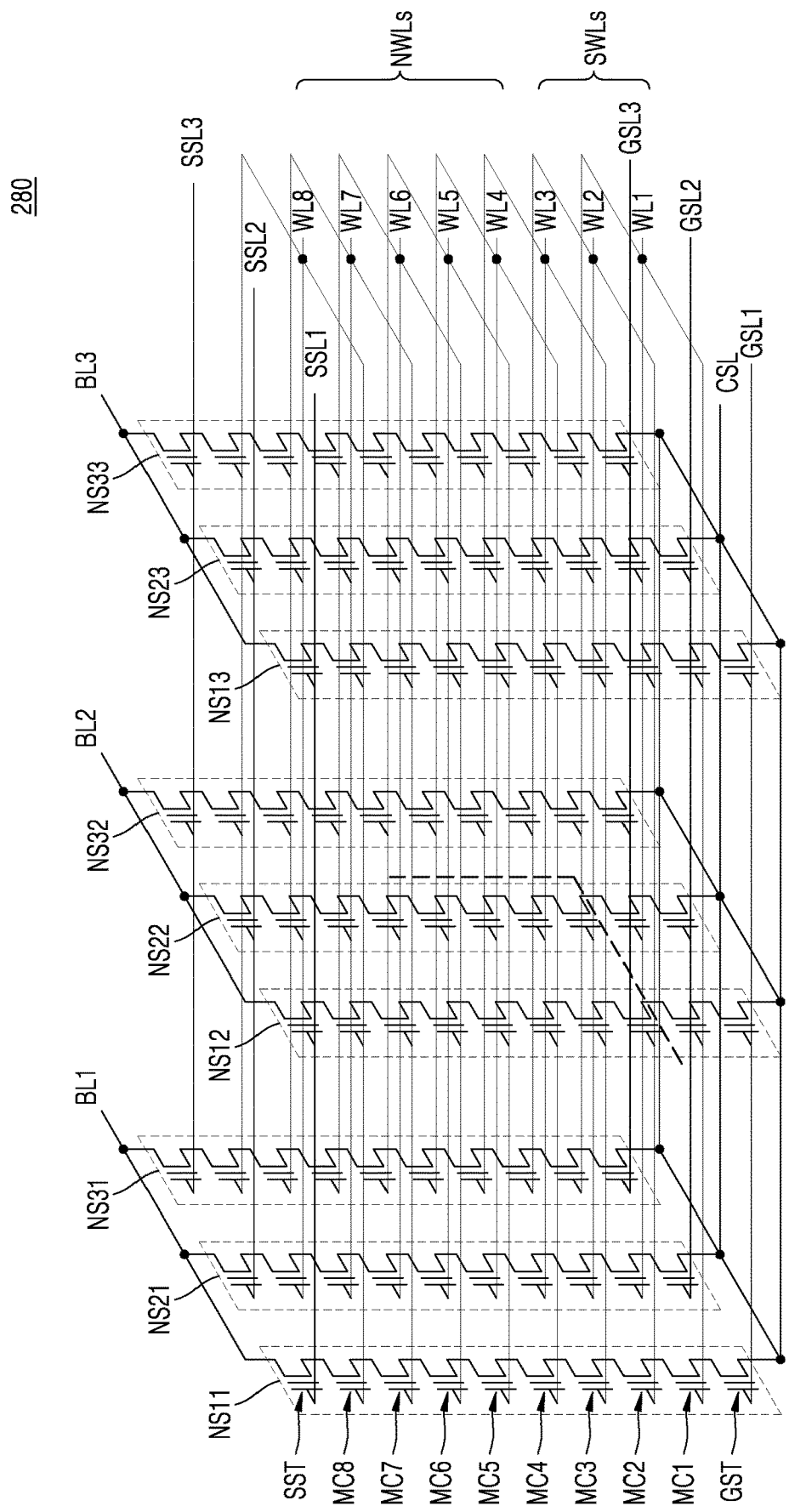
FIG. 3 is a circuit diagram of a memory block included in a memory cell array, according to an example embodiment.

FIG. 3 is a circuit diagram of a memory block 280 included in a memory cell array, according to an example embodiment.

Referring to FIG. 3, the memory block 280 may include NAND strings NS11 to NS33, first to eighth word lines WL1 to WL8, first to third bit lines BL1 to BL3, first to third ground selection lines GSL1 to GSL3, first to third string selection lines SSL1 to SSL3, and a common source line CSL.

Here, the number of NAND strings (e.g., NS11 to NS33), the number of word lines (e.g., WL1 to WL8), the number of bit lines (e.g., BL1 to BL3), the number of ground selection lines (e.g., GSL1 to GSL3), and the number of string selection lines (e.g., SSL1 to SSL3) may be varied according embodiments.

Each NAND string (e.g., NS11) may include a string selection transistor SST, a plurality of memory cells MC, and a ground selection transistor GST, which are connected in series. In the embodiment, there are 8 memory cells MC1 through MC8 in the plurality of memory cells MC, but the present disclosure is not limited thereto. The string selection transistor SST may be connected to the first string selection line SSL1 corresponding thereto. The memory cells MC may be connected to the first to eighth word lines WL1 to WL8 corresponding respectively thereto. The ground selection transistor GST may be connected to the first ground selection line GSL1 corresponding thereto. The string selection transistor SST may be connected to the first to third bit lines BL1 to BL3 corresponding thereto, and the ground selection transistor GST may be connected to the common source line CSL.

From among the NAND strings NS11 to NS33, the NAND strings NS11, NS12, and NS13 (in, for example, a first row) may be connected in common to the first string selection line SSL1. The NAND strings NS21, NS22, and NS23 in a second row may be connected in common to the second string selection line SSL2. The NAND strings NS31, NS32, and NS33 in a third row may be connected in common to the third string selection line SSL3.

According to an embodiment, the first to eighth word lines WL1 to WL8 may include a plurality of normal word lines NWLs and at least one spare word line SWL. For example, the first to third word lines WL1 to WL3 may include spare word lines SWLs, and the fourth to eighth word lines WL4 to WL8 may include normal word lines NWLs. The number and positions of spare word lines SWLs and the number and positions of normal word lines NWLs are not limited thereto and may be variously changed.

In some cases, to repair a weak memory cell, a repair operation may be performed in units of the memory block 280. In this case, even when weak memory cells concentrate in a specific word line, the memory block 280 may be entirely replaced by a spare memory block, and thus, normal (e.g., not weak) memory cells included in the memory block 280 may not be used. As a result, the efficiency and the capacity of the memory device may be reduced.

A plurality of word lines may be stacked in a vertical direction during a process. As the number of layers of stacked word lines increases, the probability of occurrences of weak word lines may increase. In addition, for a word line including a plurality of weak memory cells, a memory cell may fail and go undetected at the time of a test. A case in which the weak memory cells are concentrated and distributed in a specific word line may be referred to as a word line concentration defect.

According to an embodiment of the present disclosure, wasted memory cells may be reduced by repairing a specific word line in which the weak memory cells are concentrated. For example, a repair operation may not be performed in units of blocks to correspond to the word line concentration defect, but rather at the memory cell and word line level. In addition, a word line including the weak memory cell may not be discarded, but instead used in a cell operation mode different from an existing cell operation mode, and thus, the capacity of the memory device may be maintained. Furthermore, a repair operation may be performed by designating a word line that includes at least a reference number of weak memory cells as a weak word line, and accordingly, memory cells that are connected to the weak word line and later fail may not further impact the memory device. Hereinafter, a threshold number of weak memory cells that designates a word line connected thereto as a weak word line may be referred to as a "reference number" of weak memory cells.

Moreover, it is assumed herein that a unit of a repair operation is a unit of a word line, but the inventive concept is not necessarily limited thereto. For example, the unit of a repair operation may be at another level with more specificity than the entire memory block, such as a unit of a column.

Figure 4A:
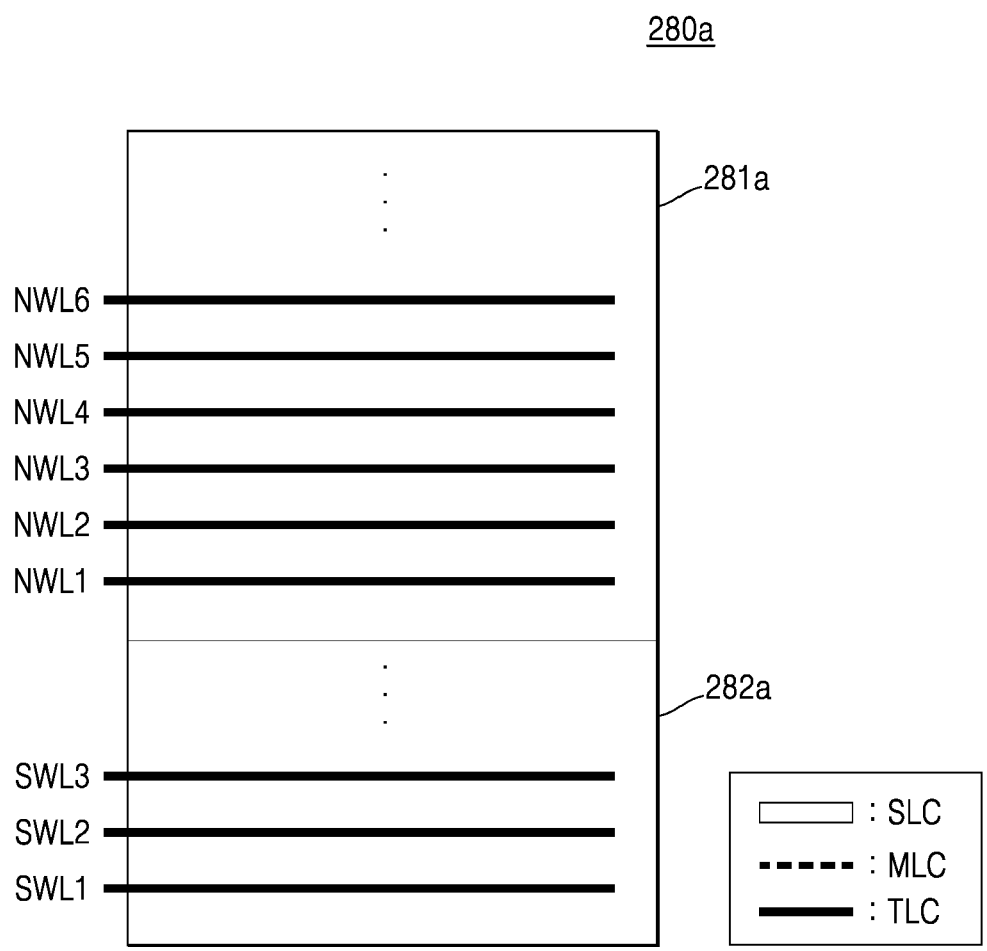
FIGS. 4A and 4B are diagrams for explaining a repair operation according to an example embodiment.
Figure 4B:
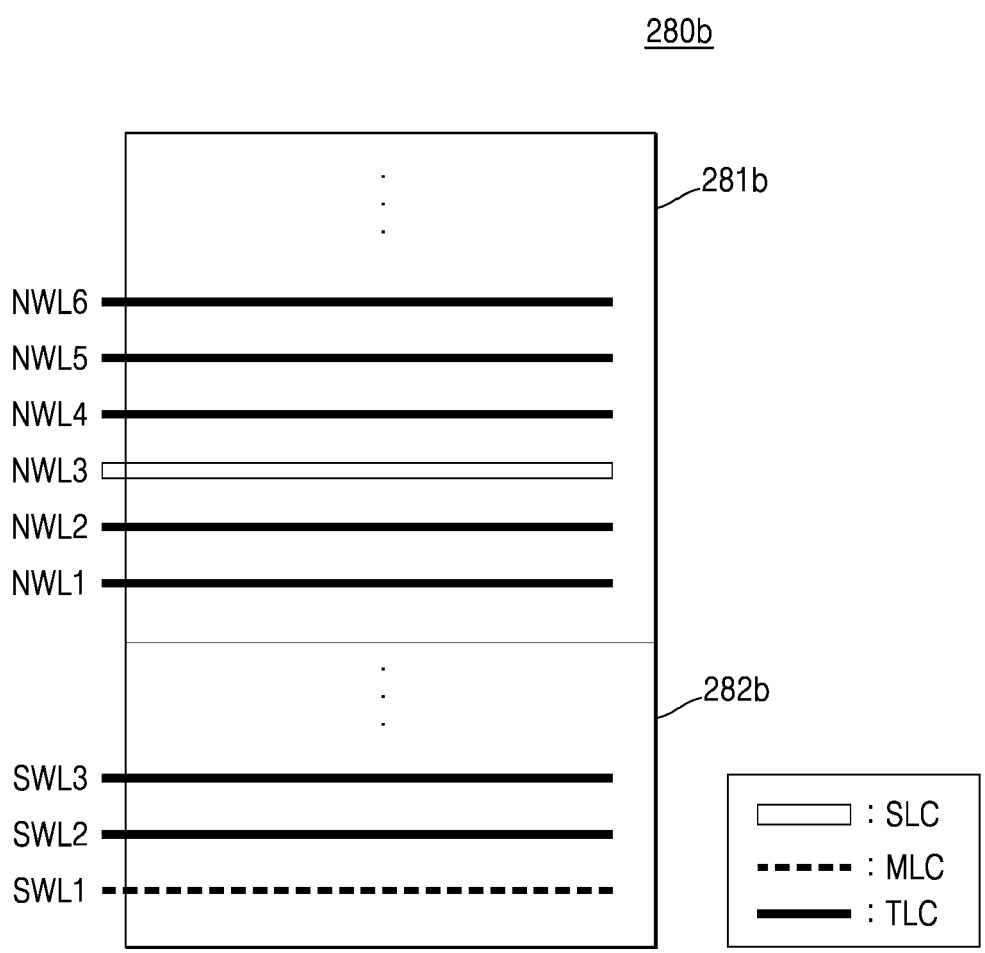

FIGS. 4A and 4B are diagrams for explaining a repair operation according to an example embodiment.

Memory blocks 280a and 280b may include a plurality of normal word lines 281a and 281b and a plurality of spare word lines 282a and 282b. For example, each of the memory blocks 280a and 280b may include first to sixth normal word lines NWL1 to NWL6 and first to third spare word lines SWL1 to SWL3. FIGS. 4A and 4B will be described with reference to FIG. 2.

Referring to FIG. 4A, each of memory cells of the memory cell array 220 may be set to a TLC mode. In this case, the memory device 200 may correspond to any one state of a wafer, a die, and a package.

In FIG. 4A, the first to sixth normal word lines NWL1 to NWL6 and the first to third spare word lines SWL1 to SWL3 may be set to the same cell operation mode, without being necessarily limited thereto. Additionally or alternatively, a cell operation mode of the first third spare word lines SWL1 to SWL3 may not be set.

Thereafter, after a test operation of the test device (e.g., 100 in FIG. 1), a weak word line may be detected by the repair controller 210. An example case in which the third normal word line NWL3 is detected as a weak word line will be described with reference to FIG. 4B. A method of detecting at least one weak word line from among the normal word lines NWL1 to NWL6 will be described in detail below with reference to FIG. 7.

When the third normal word line NWL3 is detected as the weak word line, the first spare word line SWL1 may be activated to replace the third normal word line NWL3. Activation may refer to changing a state in which access is blocked between a word line and a memory cell into a state in which access is allowed.

However, in an example referring to FIG. 4B, access to the third normal word line NWL3 that is the weak word line may not be blocked. For example, a cell operation mode of the third normal word line NWL3 may be changed from a TLC mode to an SLC mode.

When the cell operation of the third normal word line NWL3 is changed, the capacity of data that may be stored in memory cells connected to the third normal word line NWL3 may be reduced. To compensate for this reduction, the first spare word line SWL1 may be activated, and a cell operation mode of the first spare word line SWL1 may be set to an MLC mode. The number and positions of spare word lines activated may be determined by the repair controller 210 and may not necessarily be limited to a specific number and positions.

Accordingly, as a result of a repair operation according to an embodiment, only access to the first spare word line SWL1 as well as access to the third normal word line NWL3 determined as the weak word line may be enabled.

Figure 5:
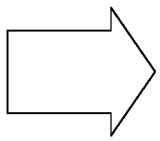
FIG. 5 is a table for explaining a repair operation according to an example embodiment.

FIG. 5 is a table for explaining a repair operation according to an example embodiment.

Referring to FIG. 5, cell operation mode information 300a and 300b including cell operation modes of memory cells included in the memory cell array (e.g., 220 in FIG. 1) may be managed in units of word lines. For example, the cell operation mode information 300a and 300b may be stored in the meta region (e.g., 223 in FIG. 2) of the memory cell array 220. In other embodiments, the unit in which the cell operation modes of the memory cells are managed is not necessarily limited to a unit of word lines.

Before a repair operation, the cell operation mode information 300a may include information about a cell operation mode of each of activated normal word lines (i.e., first to sixth normal word line NWL1 to NWL6). For example, before the repair operation, cell operation modes of the first to third spare word lines SWL1 to SWL3 may not be set.

The cell operation mode of each of the normal word lines NWL1 to NWL6 may be changed due to the repair operation described above, and changed cell operation mode information 300b may include information about a changed cell operation mode of each word line due to the repair operation. For example, the third normal word line NWL3 may be detected as a weak word line, and a cell operation mode of the third normal word line NWL3 may be changed. For example, the cell operation mode of the third normal word line NWL3 may be changed from a TLC mode to an SLC mode. In addition, to replace or supplement the weak word line, a cell operation mode of the first spare word line SWL1 may be set. For example, the cell operation mode of the first spare word line SWL1 may be set to an MLC mode.

Figure 6:
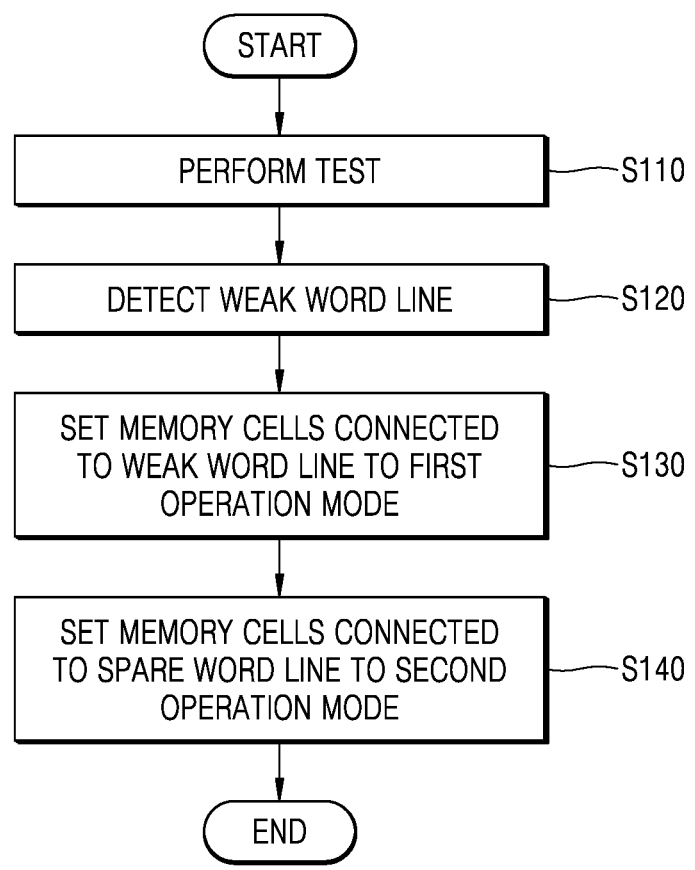
FIGS. 6 to 8 are flowcharts illustrating a method of operating a test system, according to an example embodiment.
Figure 7:
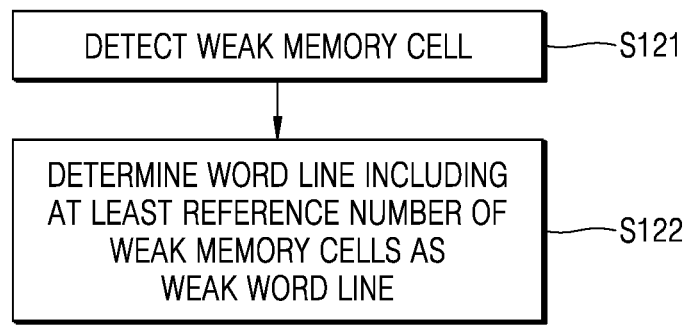
Figure 8:
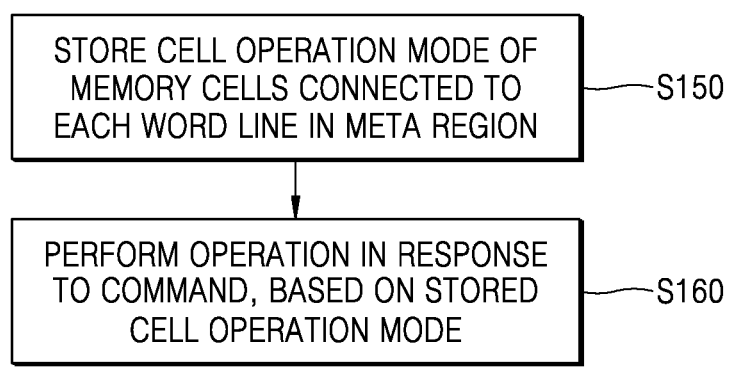

FIGS. 6 to 8 are flowcharts of a method of operating a test system, according to an example embodiment.

Referring to FIGS. 2 and 6, a test operation may be performed on a memory device 200 (S110). For example, a test device (e.g., 100 of FIG. 1) may perform a series of operations for testing the memory device 200. For example, the test device 100 may transmit a write command or an erase command for a specific memory cell to the memory device 200.

In the method of operating a test system, an operation of detecting a weak word line included in the memory cell array 220 of the memory device 200 may be performed (S120). For example, the repair controller 210 may detect a weak memory cell, which has failed a write operation or an erase operation, as a response to the write command or the erase command. The repair controller 210 may detect the weak word line based on the number of weak memory cells and/or position information about the weak memory cells. According to an embodiment, memory cells may be set to the same cell operation mode. In addition, spare word lines may remain inactive.

Upon detection of a weak word line, an operation of setting the cell operation mode of memory cells connected to the weak word line to a first operation mode may be performed (S130). For example, the repair controller 210 may change the cell operation mode of the memory cells connected to the weak word line. For example, the cell operation mode of the memory cells connected to the weak word line may be changed from a TLC mode to an SLC mode.

An operation of setting the cell operation mode of the memory cells connected to the spare word line to a second operation mode may be performed (S140). For example, when a cell operation mode of the weak memory cell is changed, the repair controller 210 may activate the spare word line to make up for a reduction in the capacity of the memory device 200. The repair controller 210 may determine the number and positions of spare word lines to be activated, and set the cell operation mode of the memory cells connected to the spare word line. For example, the cell operation mode of the memory cells connected to the spare word line may be set to an MLC mode. Moreover, as an example of a method of activating the spare word line, the spare word line may be physically connected to address decoder 240, for example, using an electronic fuse (eFuse).

The order in which operation S130 and operation S140 are performed is not necessarily limited thereto, and operations S130 and S140 may be performed in parallel.

Referring to FIG. 7, operation S120 of FIG. 6 may include operation S121 and operation S122.

An operation of detecting a weak memory cell included in the memory cell array 220 may be performed (S121). For example, the weak memory cell of the memory cell array 220 may be detected by the test device 100. The test device 100 may store information including a position of the weak memory cell in the meta region 223 of the memory cell array 220.

An operation of determining a word line that includes at least a reference number of weak memory cells as a weak word line may be performed (S122). For example, the test device 100 of FIG. 1 may detect a word line that includes at least the reference number of weak memory cells, from among memory cells connected to each word line, as the weak word line. The reference number may be set by the test device 100 and be changed according to characteristics of the memory device 200. The test device 100 may store information including a position of the weak word line in the meta region 223.

Referring to FIG. 8, an embodiment may include additional steps after the operation S140 of FIG. 6. For example, operations S150 and S160 may be performed.

An operation of storing a cell operation mode of each of a plurality of memory cells in the meta region 223 may be performed (S150). According to an embodiment, the repair controller 210 may set the cell operation mode of each of the plurality of memory cells in units of word lines, and store the set cell operation mode information in the meta region 223 of the memory cell array 220. The cell operation mode information may be changed due to a repair operation of the repair controller 210.

An operation may be performed in response to a command, based on the stored cell operation mode (S160). According to an embodiment, the repair controller 210 may perform several operations, based on the cell operation mode, as a response to a command received from the outside of the memory device 200.

According to an embodiment, when the control logic 250 receives the write command and an address of a memory cell corresponding to the write command, the control logic 250 may confirm a cell operation mode of a word line connected to the memory cell at the received address. When the word line connected to the memory cell at the received address is determined as a weak word line, a cell operation mode of the memory cell may be changed, and the control logic 250 may generate several control signals such that the memory cell performs a write operation in the changed cell operation mode. When the word line connected to the memory cell at the received address is determined as an activated spare word line, the control logic 250 may generate several control signals to access the word line. For example, the control logic 250 may generate signals to redirect a signal from the previous weak word line to the activated spare word line.

For example, operation S150 may be performed in the memory device 200, which is in a state before a packaging process, while operation S160 may be performed in the memory device (e.g., 500 in FIG. 9) after the packaging process. For example, when the memory device 500 is packaged and connected to the memory controller (e.g., 400 in FIG. 9), the memory device 500 may receive a command from the memory controller 400 and perform operation S160.

The repair operation according to the embodiment may be performed along with the test operation in the memory device 200, which is in a wafer state or die (e.g., a semiconductor die) state before the packaging process.

Moreover, although a weak memory cell is not detected in an initial test operation of the memory device 200, a normal memory cell may fail and become a weak memory cell during a chip operation after the memory device 200 is packaged. In this case, a post-package repair operation may be performed, and thus, the weak memory cell may be repaired. For example, the memory device 500 may replace or supplement the weak memory cell with a redundancy memory cell in a packaged state.

Hereinafter, a case in which a repair operation according to an embodiment is performed in the memory device 500 after packaging will be described.

Figure 9:
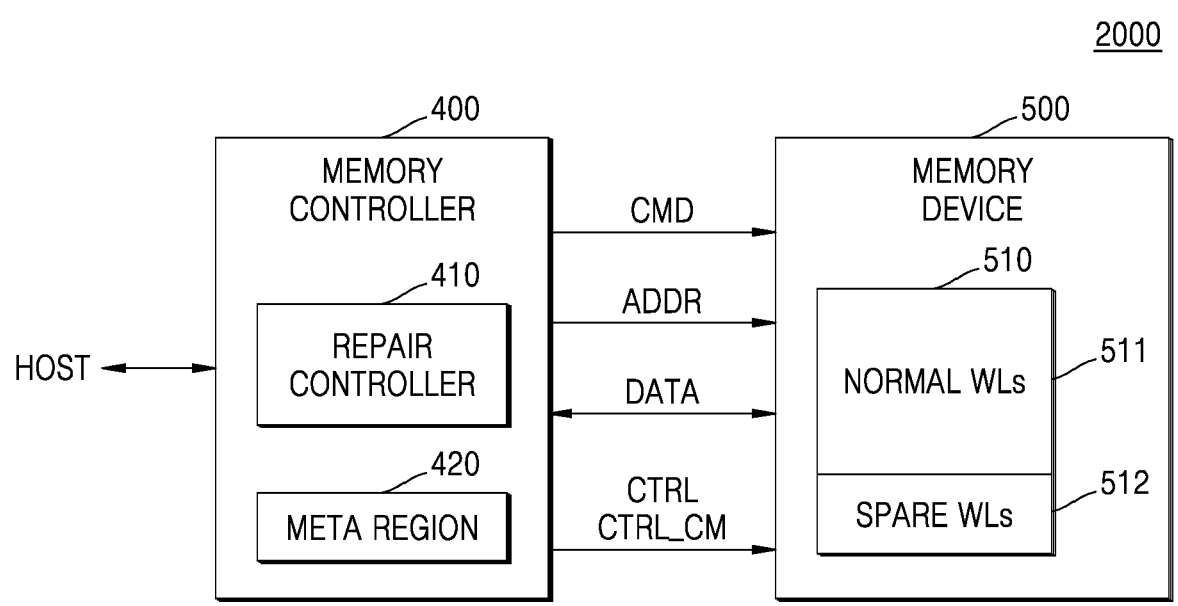
FIG. 9 is a block diagram of a storage system according to an example embodiment.

FIG. 9 is a block diagram of a storage system 2000 according to an example embodiment.

The storage system 2000 of FIG. 9 may correspond to an embodiment in which the memory device 200 of the test system 1000 of FIG. 1 is connected to the memory controller 400 in a packaged state after the memory device 200 completes a test operation. Thus, any redundant description as given with reference to FIGS. 1 to 8 may be omitted.

Referring to FIG. 9, the storage system 2000 may include a memory controller 400 and a memory device 500. The memory device 500 may include a non-volatile memory device and be implemented as a memory chip. The memory device 500 may include a memory cell array 510.

In some embodiments, the storage system 2000 may be embodied as an internal memory embedded in an electronic device. For example, the storage system 2000 may include an embedded universal flash storage (UFS) memory device, an embedded multimedia card (eMMC), or a solid-state drive (SSD). In some embodiments, the storage system 2000 may be embodied as an external memory that is attached to an electronic device and capable of detaching from the electronic device. For example, the storage system 2000 may include a UFS memory card, a compact flash (CF) card, a secure digital (SD) card, a micro-SD card, a mini-SD card, an extreme digital (xD) card, or a memory stick.

The memory device 500 may include the memory cell array 510 and correspond to the memory device 200 described above with reference to FIGS. 1 and 2. The memory cell array 510 may include a plurality of word lines to which a plurality of memory cells are connected, and the plurality of word lines may include normal word lines 511 and spare word lines 512.

The memory controller 400 may control the memory device 500 to read data DATA stored in the memory device 500 or write data DATA to the memory device 500 in response to a read/write request from a host HOST. Specifically, the memory controller 400 may control write, read, and erase operations on the memory device 500 by providing a command CMD, an address ADDR, and a control signal CTRL to the memory device 500. In addition, data DATA to be written and read data DATA may be transmitted and received between the memory controller 400 and the memory device 500.

The memory controller 400 may include a repair controller 410 and a meta region 420.

The repair controller 410 may control an operation of the memory device 500 to detect at least one weak memory cell included in the memory cell array 510 of the memory device 500. In addition, the repair controller 410 may perform a repair operation as described above according to an embodiment on the detected weak memory cell.

The repair controller 410 may control at least one spare word line to supplement or replace a weak word line connected to the detected weak memory cell. For example, the repair controller 410 may change a cell operation mode of the weak word line connected to the detected weak memory cell. In addition, at least one spare word line may be activated, and a cell operation mode of the at least one spare word line may be set. The repair controller 410 may transmit a cell operation mode control signal CTRL_CM to the memory device 500 to change or set a cell operation mode of each word line.

The repair controller 410 may information required for performing the repair operation and information required for controlling the memory device 500 based on the repair result in the meta region 420. For example, weak memory cell information may be stored in the meta region 420 to perform the repair operation, and cell operation mode information that is generated or changed based on the repair result may also be stored in the meta region 420. The pieces of information stored in the meta region 420 may be changed due to an operation of the memory controller 400.

For example, the repair controller 410 may generate the command CMD, the address ADDR, the control signal CTRL, and the cell operation mode control signal CTRL_CM in response to the read/write request received from the host HOST, based on the information stored in the meta region 420.

According to an embodiment, a repair operation may be performed on the memory device 500 at a wafer level, and accordingly the weak memory cell may be repaired even after the memory device 500 is packaged. Furthermore, because the weak word line including the weak memory cell is not discarded, and may be utilized, the capacity of the memory device 500 may be ensured.

Figure 10:
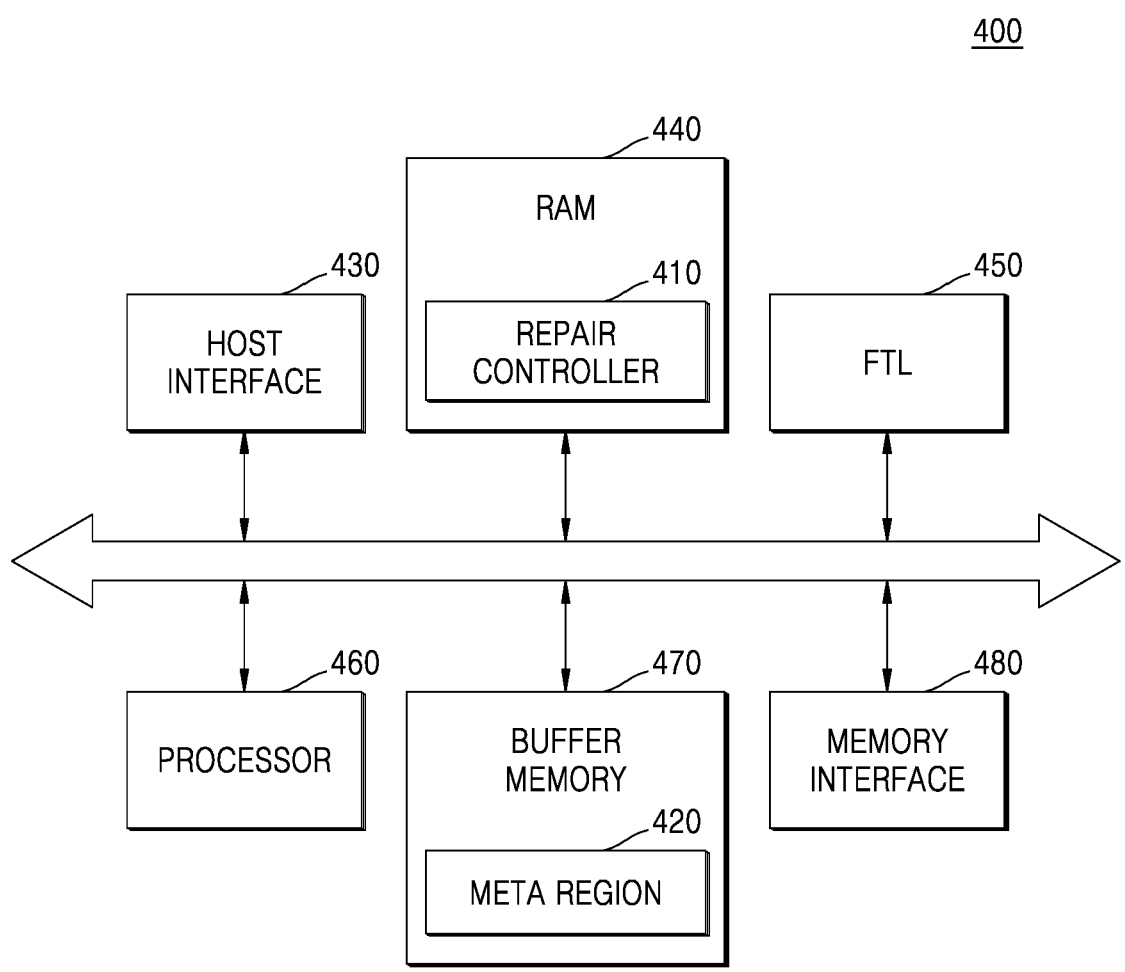
FIG. 10 is a block diagram of a memory controller according to an example embodiment.

FIG. 10 is a block diagram of a memory controller 400 according to an example embodiment.

Referring to FIGS. 9 and 10 together, the memory controller 400 may include a host interface 430, random access memory (RAM) 440, a flash translation layer (FTL) 450, a processor 460, a buffer memory 470, and a memory interface 480.

The host interface 430 may transmit and receive packets to and from the host. A packet transmitted from the host to the host interface 430 may include a command and/or data to be written to the memory device 500. A packet transmitted from the host interface 430 to the host may include a response to the command and/or data read from the memory device 500.

The memory interface 480 may transmit data to be written to the memory device 500 or receive data read from the memory device 500. The memory interface 480 may be configured to comply with a standard protocol, such as Toggle or open NAND flash interface (ONFI). The memory interface 480 may control signals for driving the memory device 500 and access the memory device 500 via the control of the processor 460. The memory interface 480 may transmit a cell operation mode control signal CTRL_CM generated by a repair controller 410 and/or a command generated based on cell operation mode information, to the memory device 500.

The RAM 440 may include the repair controller 410. The repair controller 410 may transmit a command to the memory device 500 in response to a request received from the host interface 430. The repair controller 410 may receive a response including information indicating the success or failure of an operation of the memory device 500 in response to the command, from the memory device 500.

The repair controller 410 may detect a weak memory cell included in a memory cell array 510, based on the received response. In addition, weak memory cell information corresponding to the detected result may be stored in the buffer memory 470. A unit by which a failure in the memory cell array 510 is detected by the repair controller 410 is not necessarily limited to a unit of a memory cell and may be, for example, a unit of a memory block.

Moreover, the repair controller 410 may perform the same operations as the above-described operations performed by the repair controller 210 of FIGS. 1 to 8, and redundant descriptions thereof may be omitted.

The repair controller 410 may set cell operation modes of a weak word line and a spare word line included in the memory cell array 510, based on the weak memory cell information. For example, the repair controller 410 may activate the spare word line to enable access to the spare word line, before setting the cell operation mode of the spare word line. The repair controller 410 may store cell operation mode information about each word line in the buffer memory 470.

The repair controller 410 may generate a cell operation mode control signal CTRL_CM to control the word line based on the cell operation mode information, and transmit the cell operation mode control signal CTRL_CM through the memory interface 480 to the memory device 500.

When the repair controller 410 receives a read/write request from the host through the host interface 430, the repair controller 410 may generate a command, an address, and a control signal to be transmitted to the memory device 500, based on the cell operation mode information stored in the buffer memory 470. For example, the repair controller 410 may convert the command and the address, which is included in the request, based on the cell operation mode information stored in the buffer memory 470, in response to the request received from the host, and transmit the converted command and the converted address to the memory device 500.

The FTL 450 (flash translation layer) may perform various functions, such as an address mapping operation, a wear-leveling operation, and a garbage collection operation. The address mapping operation may be an operation that includes converting a logical address received from the host into a physical address used to actually store data in the memory device 500. The wear-leveling operation may include a technique for preventing excessive deterioration of a specific block by allowing all of the blocks of the memory device 500 to be uniformly used. As an example, the wear-leveling operation may be implemented using a firmware technique that balances erase counts of physical blocks. The garbage collection operation may include a technique for ensuring usable capacity in the memory device 500 by erasing an existing block after copying valid data of the existing block to a new block.

The FTL 450 may perform an address mapping operation based on the cell operation mode information. For example, when a spare word line is activated due to a repair operation, a new logical address may be assigned to the activated spare word line. The FTL 450 may map the logical address of the activated spare word line to a physical address and enable access to a memory cell connected to the spare word line.

The processor 460 may execute various programs stored in the RAM 440 and control all operations of the storage system 2000. For example, the processor 460 may execute a program included in the repair controller 410.

The buffer memory 470 may temporarily store data received from the host through the host interface 430 or data received from the memory device 500.

The buffer memory 470 may include the meta region 420 including information about the weak memory cell detected by the repair controller 410 and cell operation mode information generated as a result of the repair operation. The information stored in the meta region 420 may be updated or changed by the repair controller 410.

The meta region 420 may correspond to the meta region 223 of FIG. 2, and the meta region 420 may include the information included in the meta region 223, and further include the logical address of the memory cell and the physical address of the memory cell corresponding thereto.

The buffer memory 470 may be implemented as a volatile memory, such as dynamic RAM (DRAM), static DRAM (SDRAM), double data rate (DDR) SDRAM, low-power DDR (LPDDR) SDRAM, and/or graphics RAM (GRAM), or a non-volatile memory, such as ferroelectric RAM (FRAM), resistive RAM (ReRAM), spin-transfer torque magnetic RAM (STT-MRAM), and/or phase-change RAM (PRAM).

Moreover, FIG. 10 illustrates an example in which the operations of detecting and repairing the defective word line according to one embodiment are performed by software, but embodiments are not necessarily limited thereto. As an example, in the embodiment shown in FIG. 10, at least some of the operations performed by executing software loaded in the RAM 440 may be performed by a circuit implemented in hardware.

Figure 11:
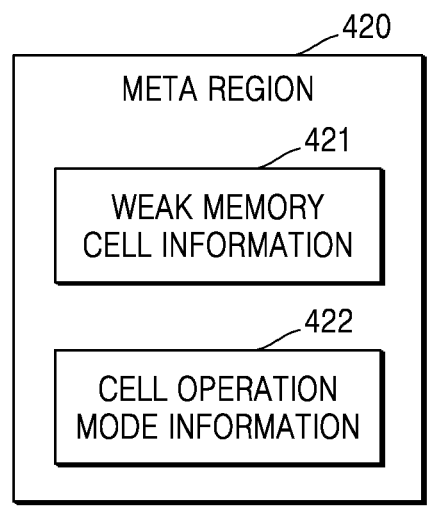
FIG. 11 is a diagram of a meta region according to an example embodiment.
Figure 13:
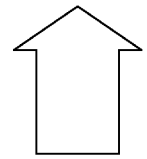
FIG. 13 is a table for explaining cell operation mode information according to an example embodiment.

FIG. 11 is a diagram of a meta region according to an example embodiment. FIG. 12 is a table for explaining weak memory cell information according to an example embodiment. FIG. 13 is a table for explaining cell operation mode information according to an example embodiment.

Referring to FIG. 11, a meta region 420 may include weak memory cell information 421 and cell operation mode information 422. Hereinafter, FIGS. 11 to 13 will be described with reference to FIG. 9, which assumes that the memory cell array 510 of the memory device 500 includes a plurality of normal word lines (e.g., first to sixth normal word lines NWL1 to NWL6) and a plurality of spare word lines (e.g., first to third spare word lines SWL1 to SWL3) as shown in FIG. 4A.

Referring to FIG. 12, a first table 421a shows the weak memory cell information 421 when the memory cells in a plurality of memory cells are all normal, and a second table 421b shows the weak memory cell information 421, which is changed upon detecting a weak memory cell.

In response to a read/write request of the host, the memory controller 400 may control the memory device 500 by transmitting a command to the memory device 500 such that the memory device 500 performs a write operation, a read operation, or an erase operation. Subsequently, the repair controller 410 may determine whether the memory device 500 succeeds in the operation in response to the command. For example, the repair controller 410 may determine whether the memory device 500 succeeds in a write operation or an erase operation in response to a write command or an erase command. The repair controller 410 may determine whether a memory cell is normal NORMAL or defective FAIL, based on the success or failure of the operation. In the present embodiment, a method of determining whether the memory cell is defective by the repair controller 410, based on the success or failure of the write operation or the erase operation on the memory cell has been described. However, a method of determining whether the memory cell is defective by the repair controller 410 is not necessarily limited thereto. In addition, a range of detected failures is not necessarily so limited.

Before the repair controller 410 performs a repair operation, the weak memory cell information 421 may be the same as shown in the first table 421a. As an example, memory cells at intersections between the first to sixth normal word lines NWL1 to NWL6 and the first to fourth bit lines BL1 to BL4 may be all normal. Although FIG. 12 illustrates a case in which the first table 421a does not include states of memory cells connected to the first to third spare word lines SWL1 to SWL3, the inventive concept is not necessarily limited thereto. In another case, for example, the first table 421a may include information indicating that the memory cells connected to the first to third spare word lines SWL1 to SWL3 are normal.

The repair controller 410 may update the weak memory cell information 421 as shown in the second table 421b, based on position information about the weak memory cell.

For example, the second table 421b may include information indicating that the memory cell at the intersection between the first normal word line NWL1 and the fourth bit line BL4, the memory cell at the intersection between the third normal word line NWL3 and the first bit line BL1, the memory cell at the intersection between the third normal word line NWL3 and the fourth bit line BL4, and the memory cell at the intersection between the fifth normal word line NWLS and the second bit line BL2 are weak memory cells.

Moreover, the repair controller 410 may determine a period in which to update the weak memory cell information 421. For example, the repair controller 410 may transmit a command to the memory device 500 and update the weak memory cell information 421 each time the repair controller 410 receives information indicating the success or failure of an operation performed in response to the command.

The repair controller 410 may detect a weak word line, from among the plurality of normal word lines, based on the second table 421b. As an example, a word line that includes at least a reference number of weak memory cells may be determined as the weak word line. For example, when the reference number is 2, the third normal word line NWL3 including two weak memory cells may be determined as the weak word line. The meta region 420 may also include weak word line information. Moreover, a method of determining the weak word line based on the weak memory cell information 421 is not necessarily limited thereto.

Referring to FIG. 13, the cell operation mode information 422 may include a logical address of a memory cell, and a physical address and a cell operation mode corresponding to the logical address. The following description assumes that a cell operation mode is set and changed in units of word lines, but a unit in which the cell operation mode is set is not necessarily limited thereto. For example, the cell operation mode information 422 may include physical addresses of the first to sixth normal word lines NWL1 to NWL6 and logical addresses and operation modes corresponding thereto and include physical addresses of the first to third spare word lines SWL1 to SWL3 and logical addresses and operation modes corresponding thereto.

A third table 422a may correspond to the first table 421a of FIG. 12 and indicate cell operation mode information 422 corresponding to a case in which a plurality of memory cells are all normal.

The third table 422a may include logical addresses LAN1 to LAN6 of the first to sixth normal word lines NWL1 to NWL6 and physical addresses PAN1 to PAN6 of the first to sixth normal word lines NWL1 to NWL6 corresponding to the logical addresses LAN1 to LAN6. Furthermore, the third table 422a may include cell operation modes of the first to sixth normal word lines NWL1 to NWL6.

In this case, a spare word line may not be activated, and access to the spare word line by the memory controller 400 may be blocked. However, the third table 422a may still include physical addresses PAS1 to PAS3 of the first to third spare word lines SWL1 to SWL3.

When a plurality of memory cells connected to a normal word line are all normal, an operation mode of memory cells connected to the first to sixth normal word lines NWL1 to NWL6 may already remain set to a specific cell operation mode. Although FIG. 13 illustrates a state in which the memory cells connected to the first to sixth normal word lines NWL1 to NWL6 are all set to a TLC mode, the inventive concept is not necessarily limited thereto, and all the memory cells may not be in the same operation mode.

A fourth table 422b may correspond to the second table 421b of FIG. 12 and indicate the cell operation mode information 422 after the repair controller 410 performs the repair operation. Due to the repair operation, a cell operation mode of the weak word line may be changed, and a cell operation mode of the spare word line may be newly set by activating the spare word line.

For example, when the third normal word line NWL3 is detected as the weak word line, a cell operation mode of the third normal word line NWL3 may be changed from the TLC mode to an SLC mode. To make up for a reduction in memory capacity caused by this operation, the first spare word line SWL1 may be activated and set to an MLC mode. The fourth table 422b may include a logical address LAS1 corresponding to the physical address PAS1 of the first spare word line SWL1.

Figure 14:
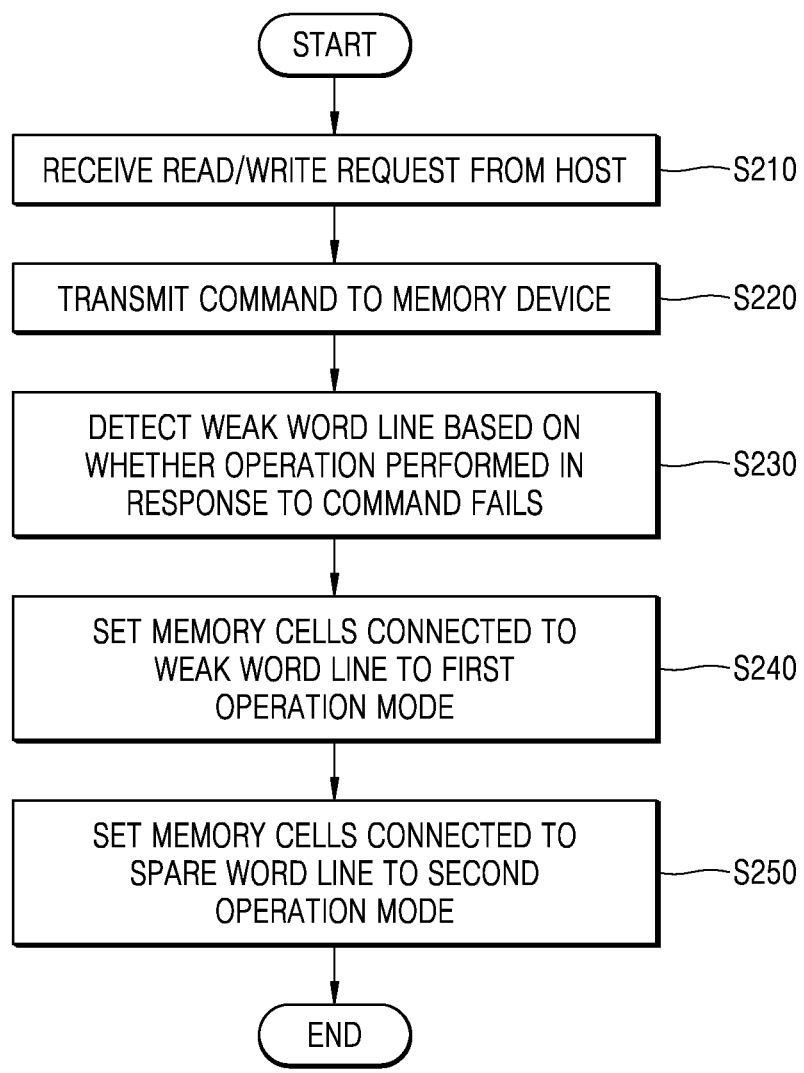
FIG. 14 is a flowchart of a method of operating a memory controller, according to an example embodiment.

FIG. 14 is a flowchart of a method of operating the memory controller 400 of FIG. 9, according to an example embodiment.

Referring to FIGS. 9 and 14 together, an operation of receiving a read/write request from a host may be performed (S210). For example, the memory controller 400 may receive the read/write request from the host through a host interface (e.g., 430 in FIG. 10).

An operation of transmitting a command to the memory device 500 may be performed (S220). For example, the memory controller 400 may transmit write, read, erase commands to the memory device 500.

A weak word line may be detected based on the success or failure of an operation performed in response to the command (S230). For example, the repair controller 410 may receive information indicating the success or failure of the operation performed in response to the command transmitted to the memory device 500 in operation S220, from the memory device 500. The repair controller 410 may detect a weak memory cell based on the failure of the operation, and detect the weak word line based on weak memory cell information (refer to 421 in FIG. 11). For example, if the repair controller 410 detects at least a reference number of weak memory cells connected to a word line, the repair controller 410 may determine the word line to be a weak word line.

An operation of setting memory cells connected to the weak word line to a first operation mode may be performed (S240). For example, the repair controller 410 may set a cell operation mode of the memory cells connected to the weak word line to the first operation mode. The first operation mode may be different from a cell operation mode of a normal word line. For example, when the cell operation mode of the normal word line is a TLC mode, the first operation mode may be an SLC mode, without being necessarily limited thereto.

An operation of setting memory cells connected to a spare word line to a second operation mode may be performed (S250). For example, the repair controller 410 may activate the spare word line to make up for loss in memory capacity due to a change in the cell operation mode of the weak word line. The activation of the spare word line may include a series of operations to allow access the memory cell connected to the spare word line. For example, the activation of the spare word line may include assigning a logical address to the memory cell connected to the spare word line to write data to the memory cell, and mapping the assigned logical address to a physical address of the memory cell.

For example, the repair controller 410 may set a cell operation mode of memory cells connected to the activated spare word line to the second operation mode. The second operation mode may be different from the cell operation mode of the normal word line and/or the first operation mode. For example, when the cell operation mode of the normal word line is the TLC mode and the first operation mode is the SLC mode, the second operation mode may be an MLC mode, without being necessarily limited thereto.

Moreover, although FIG. 14 illustrates an example in which operation S250 is performed after operation S240, an order in which operations S240 and S250 are performed is not necessarily limited thereto, and operations S240 and S250 may be performed, for example, in parallel.

Figure 15:
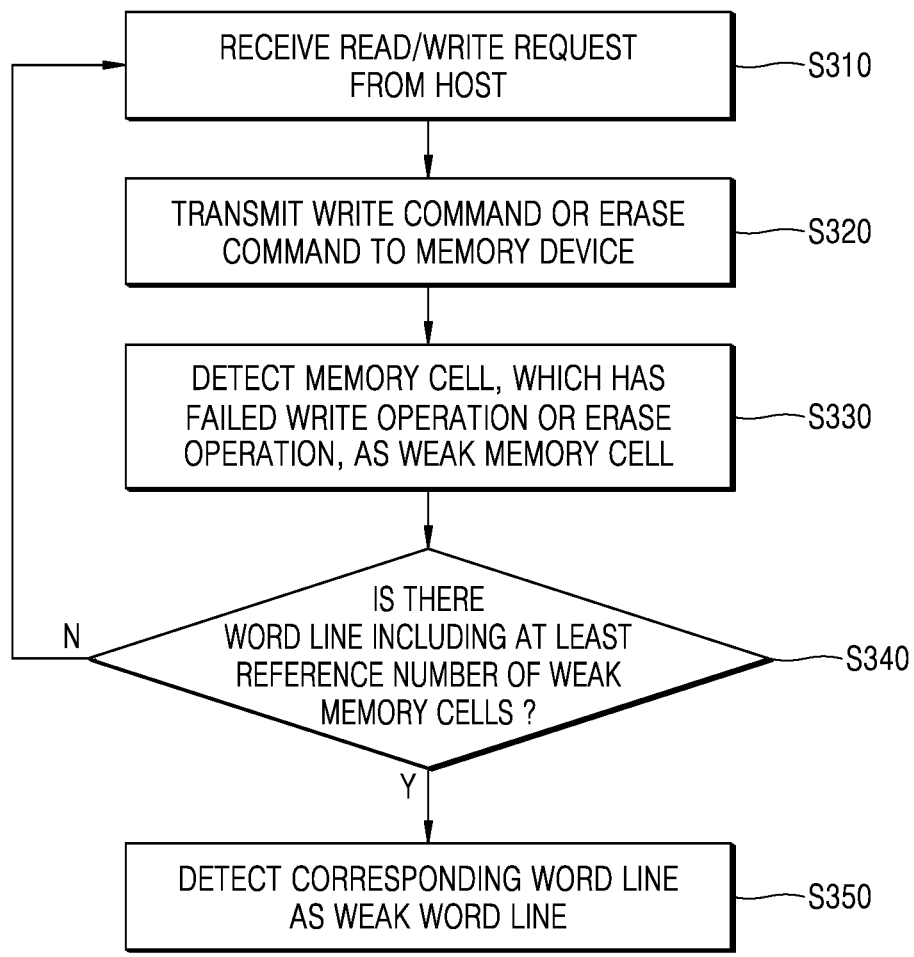
FIG. 15 is a flowchart of a method of operating a memory controller, according to an example embodiment.

FIG. 15 is a flowchart of a method of operating the memory controller 400 of FIG. 9, according to an example embodiment.

A plurality of operations of FIG. 15 may correspond to operations S210 to S230 of FIG. 14, according to an embodiment, and the redundant descriptions from FIG. 14 may be omitted.

Referring to FIGS. 9 and 15, an operation of receiving a read/write request from a host may be performed (S310).

The memory device 500 may perform an operation of transmitting a write command or an erase command (S320).

A memory cell that has failed a write operation or an erase operation may be detected as a weak memory cell (S330). For example, the memory cell that has failed the write operation or the erase operation at least a reference number of times may be detected as the weak memory cell.

For example, a memory cell that has failed in a read operation in response to a read command may also be detected as the weak memory cell. It may be determined that the memory cell that has failed the read operation has lower reliability than the memory cell that has failed the write operation or the erase operation. Accordingly, in an embodiment, the memory cell that has failed the read operation may be excluded from an object of a repair operation according to the present embodiment.

An operation of ascertaining whether there is a word line that includes at least a reference number of weak memory cells may be performed (S340). For example, the repair controller 410 may determine the reference number for detecting a weak word line.

When there is a word line that includes at least the reference number of weak memory cells in operation S340, the word line may be detected as a weak word line (S350).

When there is not a word line that includes at least the reference number of weak memory cells in operation S340, operation S310 may be performed again.

FIG. 15 illustrates a case in which each time a command is transmitted to the memory device 500, the weak memory cell is detected, and the weak word line is detected. However, a period in which the operation of detecting the weak memory cell and/or the operation of detecting the weak word line is performed is not limited thereto.

Figure 16:
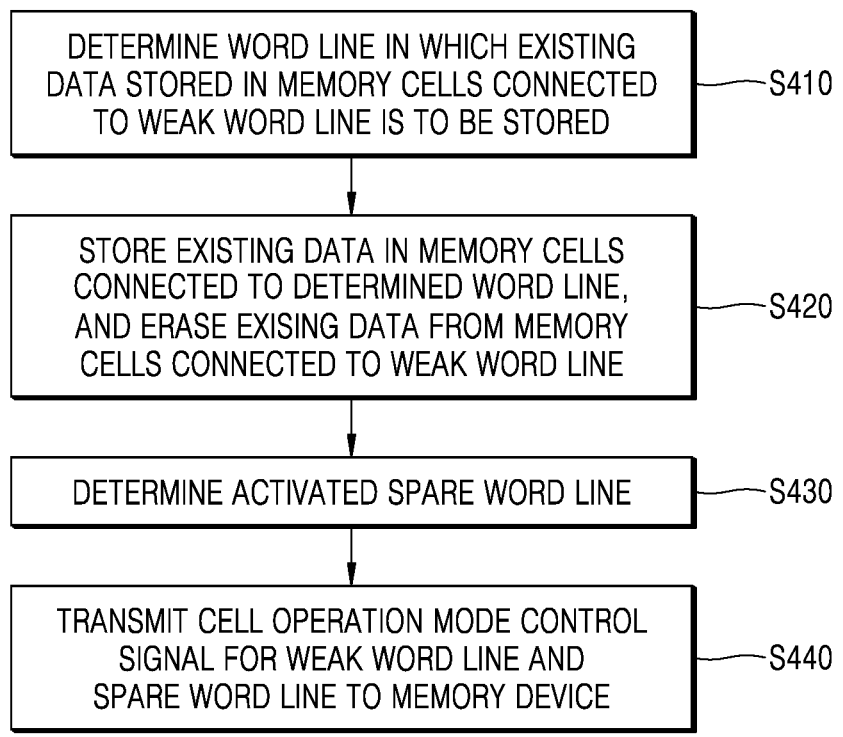
FIG. 16 is a flowchart of a method of operating a memory controller, according to an example embodiment.

FIG. 16 is a flowchart of a method of operating a memory controller, according to an example embodiment.

FIG. 16 may correspond to operations S240 and S250 of FIG. 14, according to an embodiment.

Referring to FIGS. 9 and 16, an operation of determining a word line in which existing data stored in memory cells connected to a weak word line is to be stored may be performed (S410). For example, step S410 may describe a process which allows data stored on weak word lines to be transferred to new word lines.

According to an embodiment, a cell operation mode of a word line that is detected as the weak word line may be changed, and the word line may then operate in the changed cell operation mode. To this end, an operation of transferring the existing data stored in the memory cells connected to the weak word line to other memory cells may be performed.

Therefore, according to an embodiment, the repair controller 410 may determine new memory cells for which the existing data stored in the memory cells connected to the weak word line is to be stored, and/or a new word line connected to the memory cells in which the existing data is to be stored. The word line may be a spare word line or a normal word line excluding the weak word line. To store the existing data in the spare word line, an operation of assigning a logical address to the spare word line by activating the spare word line and an operation of setting a cell operation mode of the spare word line may be performed as described above.

The existing data may be stored in the memory cells connected to the determined word line, and the existing data stored in the memory cells connected to the weak word line may be erased (S420). For example, the repair controller 410 may transmit a repair copy command to the memory device 500.

The repair copy command may refer to a command for controlling the memory device 500 to move data. For example, the repair controller 410 may provide information about the weak word line in which the existing data is stored and information about the word line in which the existing data is to be stored, to the memory device 500 along with the repair copy command.

In addition, by transmitting the repair copy command to the memory device 500, the repair controller 410 may copy the existing data to the memory cells connected to the word line determined in operation S410, and erase the existing data from the memory cells connected to the weak word line.

For example, to put all the memory cells connected to the weak word line into an erased state, the repair controller 410 may block access to the weak word line not to write new data or read stored data.

An operation of determining a spare word line to be activated may be performed (S430). For example, the repair controller 410 may determine the spare word line to be activated and store position information about the activated spare word line in a meta region 420. In addition, the repair controller 410 may determine the cell operation mode of the spare word line and store the determined cell operation mode in the meta region 420.

An operation of transmitting a cell operation mode control signal for setting the cell operation mode of the weak word line and the cell operation mode of the spare word line to the memory device 500 may be performed (S440). For example, the repair controller 410 may transmit a cell operation mode control signal including the changed cell operation mode of the weak word line, the position information about the activated spare word line, and the cell operation mode of the spare word line to the memory device 500. Accordingly, the memory device 500 may contain all necessary information to redirect data to a non-weak cell.

Moreover, the repair controller 410 may not transmit a cell operation mode control signal for changing a cell operation mode of a word line to the memory device 500, but rather convert a command to be transmitted to the memory device 500, in response to a request received from a host. For example, the repair controller 410 may convert a command, an address, and data, which are to be transmitted to the memory device 500, based on the cell operation mode information 422. In this case, operation S440 may be omitted. After the spare word line is activated, an operation of the memory device 500 may be performed through a conversion operation of the repair controller 410.

Figure 17:
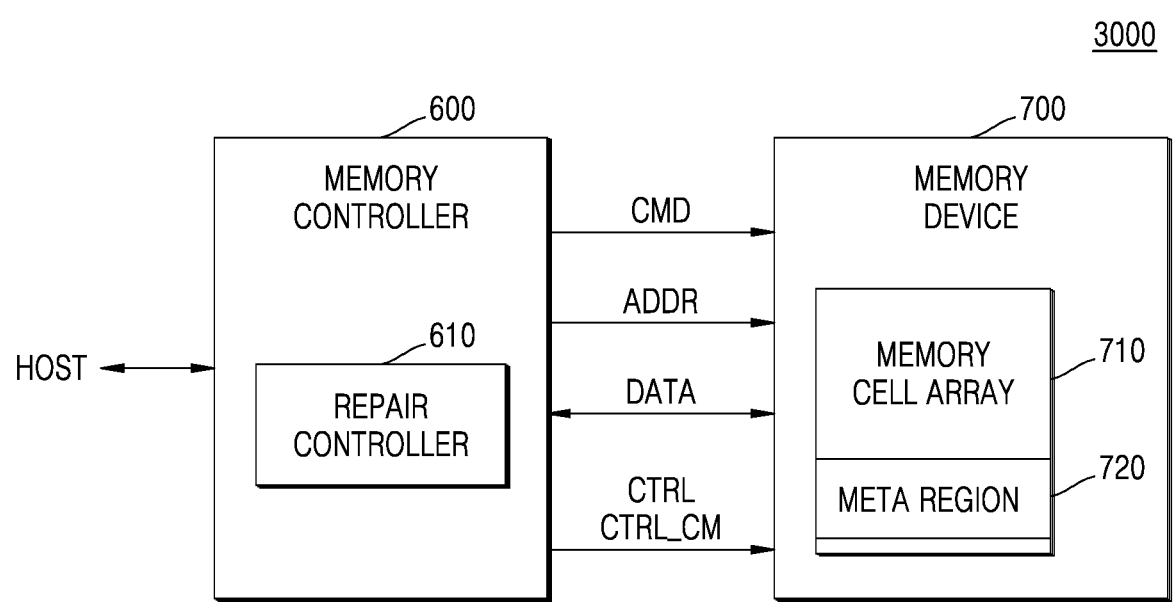
FIG. 17 is a block diagram of a storage system according to an example embodiment.

FIG. 17 is a block diagram of a storage system 3000 according to an example embodiment.

Referring to FIG. 17, the storage system 3000 may include a memory controller 600 and a memory device 700. FIG. 17 may correspond to a modified embodiment of FIG. 9, and redundant description with reference to FIG. 9 may be omitted.

The memory device 700 may include a memory cell array 710 and correspond to the memory devices 200 and 500 described above with reference to FIGS. 1, 2, and 9. The memory cell array 710 may include a meta region 720. The meta region 720 may include memory cells connected to a normal word line or memory cells connected to a spare word line in the memory cell array 710.

The memory controller 600 may include a repair controller 610. The repair controller 610 may control an operation of the memory device 700 to detect at least one weak memory cell included in the memory cell array 710 included in the memory device 700. A repair operation according to an embodiment may be performed on the detected weak memory cell.

The repair controller 610 may control at least one spare word line to supplement or replace a weak word line connected to the detected weak memory cell. For example, the repair controller 610 may change a cell operation mode of the weak word line connected to the detected weak memory cell. Also, the at least one spare word line may be activated, and a cell operation mode of the at least one spare word line may be set. The repair controller 610 may transmit a cell operation mode control signal CTRL_CM to the memory device 700 to change or set a cell operation mode of each word line.

The repair controller 610 may store information required to perform the repair operation and information required to control the memory device 700 based on the repair result in the meta region 720 of the memory cell array 710. For example, the meta region 720 may include weak memory cell information and cell operation mode information generated based on the repair result.

For example, the repair controller 610 may detect a weak memory cell and store position information about the weak memory cell in the meta region 720. In addition, the repair controller 610 may generate weak word line information, based on the stored position information about the weak memory cell, and store the weak word line information in the meta region 720.

The repair controller 610 may determine a cell operation mode of the weak word line, the number and positions of spare word lines, a cell operation mode of the at least one spare word line based on the weak word line information. The repair controller 610 may store the cell operation mode of the weak word line, the number and positions of spare word lines, and the cell operation mode of the at least one spare word line in the meta region 720.

Figure 18:
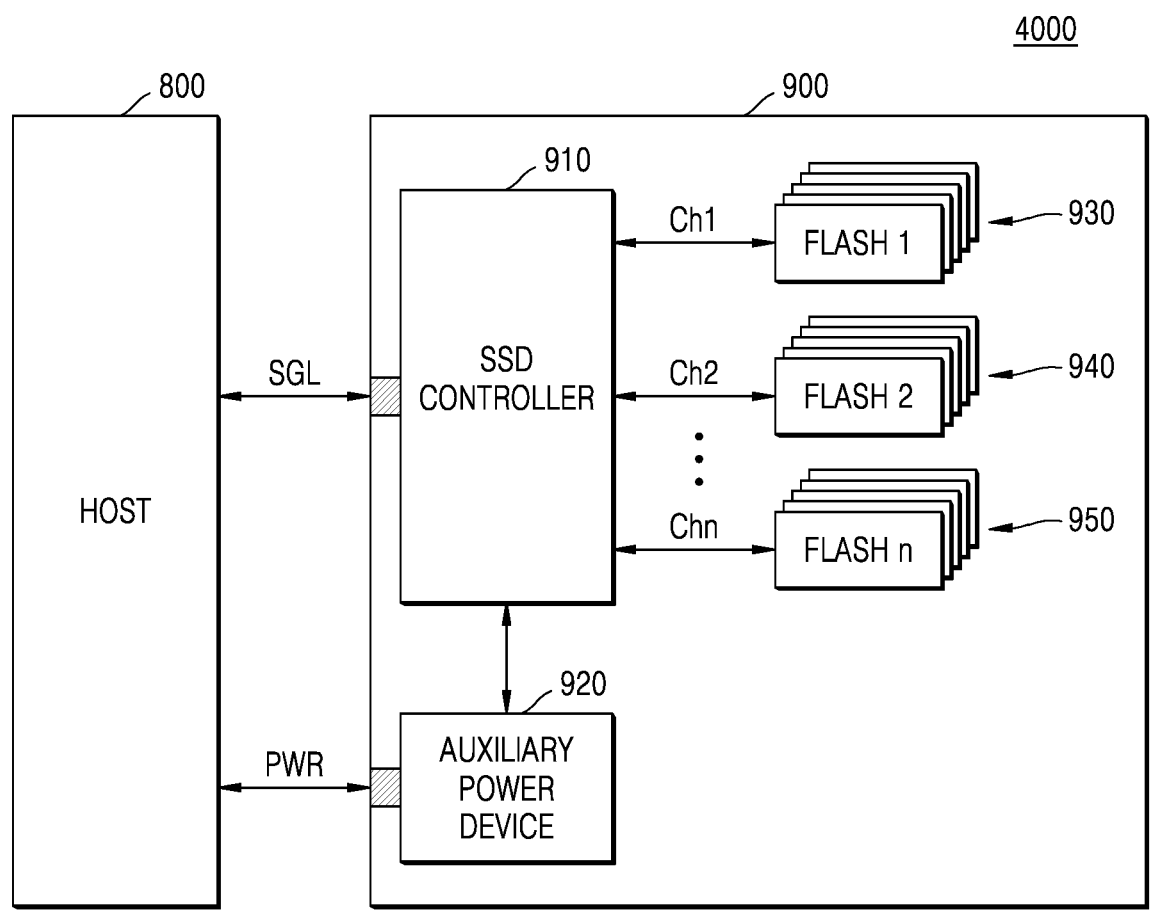
FIG. 18 is a block diagram of a solid-state drive (SSD) according to an example embodiment.

FIG. 18 is a block diagram of an SSD system 4000 according to an example embodiment.

Referring to FIG. 18, the SSD system 4000 may include a host 800 and an SSD 900. The SSD 900 may transmit and receive signals to and from the host 800 through a signal connector SGL and receive power through a power connector PWR. The SSD 900 may include an SSD controller 910, an auxiliary power device 920, and a plurality of non-volatile memory devices (e.g., first to third non-volatile memory devices 930 to 950).

The SSD controller 910 may control the first to third non-volatile memory devices 930 to 950 in response to a signal received from the host 800. For example, the SSD controller 910 and the first to third non-volatile memory devices 930 to 950 may correspond to the memory controller 400 or 600 and three of the non-volatile memory device 200 or 500, respectively, which are described with reference to FIGS. 9 to 17.

The auxiliary power device 920 may be connected to the host 800 through the power connector PWR. The auxiliary power device 920 may receive power from the host 800 and be charged. The auxiliary power device 920 may provide power to the SSD system 4000 when power supply from the host 800 is not smooth or continuous. For example, the auxiliary power device 920 may be inside or outside the SSD 900. For instance, the auxiliary power device 920 may be on a main board of the SSD system 4000 and provide auxiliary power to the SSD 900.

The first to third non-volatile memory devices 930 to 950 may be used as storage media of the SSD 900. The first to third non-volatile memory devices 930 to 950 may be connected to the SSD controller 910 through a plurality of channels Ch1 to Chn. At least one non-volatile memory may be connected to each of the channels Ch1 to Chn. The first to third non-volatile memory devices 930 to 950 connected to each of the channels Ch1 to Chn may be connected to the same data bus.

The SSD controller 910 may include a repair controller according to the above-described embodiments. The repair controller may be implemented in hardware, software, or a combination thereof.

The repair controller may detect a weak word line included in each of the first to third non-volatile memory devices 930 to 950 and change a cell operation mode of memory cells connected to the weak word line in accordance with the above description. In addition, a spare word line may be activated, and a cell operation mode of the spare word line may be set, and thus, write, read, and erase operations may be performed on memory cells connected to the spare word line.

For example, information generated due to an operation of the repair controller may be temporarily stored in the SSD controller 910 or stored in each of the first to third non-volatile memory devices 930 to 950 in a non-volatile manner.

The weak word line and the spare word line may be in different non-volatile memory devices. For example, a weak word line may occur in the first non-volatile memory device 930, and a spare word line of the second non-volatile memory device 940 may be selected and activated to repair the weak word line.

As described above, a repair operation in accordance with the present disclosure may allow the utilization of a weak word line. Accordingly, the memory capacity of a memory device in accordance with the present disclosure may be ensured by accessing a spare word line.

While the inventive concept has been particularly shown and described with reference to embodiments thereof, it will be understood that various changes in form and details may be made therein without departing from the spirit and scope of the following claims.

What is claimed is:

1. A memory device comprising: a memory cell array comprising a plurality of normal word lines and at least one spare word line; and a repair controller configured to set memory cells which are connected to at least one weak word line from among the normal word lines to a first operation mode, and further configured to set memory cells connected to the at least one spare word line to a second operation mode, wherein the at least one weak word line is detected based on a test result, wherein, during a test process, memory cells connected to the plurality of normal word lines are set to a third operation mode configured to write (n+m)-bit data, the first operation mode is configured to write n-bit data to the memory cells connected to the at least one weak word line, the second operation mode is configured to write m-bit data to the memory cells connected to the at least one spare word line, and both n and m are natural numbers greater than or equal to 1 and m is greater than n.

2. The memory device of claim 1, wherein the at least one weak word line includes a plurality of weak memory cells,
wherein a number of weak memory cells included in each of the at least one weak word line is greater than or equal to a reference number.

3. The memory device of claim 1, wherein the memory cell array, comprises a meta region configured to store metadata,
wherein the repair controller stores a cell operation mode of the at least one weak word line and a cell operation mode of the at least one spare word line in the meta region.

4. The memory device of claim 3, wherein the memory device receives a command from a memory controller and performs an operation in response to the command, based on the cell operation mode stored in the meta region.

5. The memory device of claim 1, wherein the first operation mode is a single-level cell (SLC) mode, the second operation mode is a multi-level cell (MLC) mode, and the third operation mode is a triple-level cell (TLC) mode.

6. A memory controller connected to a memory device comprising a plurality of normal word lines and at least one spare word line, wherein the memory controller is configured to: transmit a command to the memory device, detect at least one of the normal word lines as a weak word line, when an operation performed in response to the command fails, set memory cells connected to the weak word line to a single-level cell (SLC) operation mode, and set memory cells connected to the at least one spare word line to a multi-level cell (MLC) operation mode, wherein memory cells connected to the plurality of normal word lines are set to a third operation mode configured to write (n+m)-bit data, and wherein the first operation mode is configured to write n-bit data to the memory cells connected to the weak word line, the second operation mode is configured to write m-bit data to the memory cells connected to the at least one spare word line, and each of n and m is a natural number greater than or equal to 1 and m is greater than n.

7. The memory controller of claim 6, further comprising a buffer memory including logical addresses, physical addresses, and operation mode information of the memory cells connected to the weak word line, and further including logical addresses, physical addresses, and operation mode information of the memory cells connected to the at least one spare word line.

8. The memory controller of claim 7, wherein the memory controller is configured to transmit a repair copy command to the memory device and to store existing data, the existing data stored in the memory cells connected to the weak word line, in at least one of memory cells connected to the normal word lines and the memory cells connected to the at least one spare word line.

9. The memory controller of claim 8, wherein the memory controller is configured to receive the existing data, the existing data stored in the memory cells connected to the weak word line, from the memory device in response to the repair copy command, and further configured to temporarily store the existing data in the buffer memory, and transmit the existing data to the memory device.

10. The memory controller of claim 7, wherein the memory controller is configured to generate the logical addresses of the memory cells connected to the at least one spare word line, and to map the logical address to the physical addresses of the memory cells connected to the at least one spare word line.

11. The memory controller of claim 7, wherein the memory controller is configured to transmit a cell operation mode control signal including the operation mode information of the memory cells connected to the weak word line and the operation mode information of the memory cells connected to the at least one spare word line to the memory device.

12. The memory controller of claim 7, wherein the memory controller is configured to convert a command and an address in response to a request received from a host, based on the operation mode information of the memory cells connected to the weak word line and the operation mode information of the memory cells connected to the at least one spare word line, and to transmit the converted command and the converted address to the memory device.

13. The memory controller of claim 6, wherein the memory controller is configured to detect a normal word line including at least a reference number of weak memory cells as the weak word line, based on a number of weak memory cells included in each of the normal word lines.

14. The memory controller of claim 13, wherein the command comprises a write command or an erase command.

15. A method of operating a storage device comprising a memory device and a memory controller, the memory device comprising a plurality of normal word lines and at least one spare word line, the method comprising: detecting at least one of the normal word lines as a weak word line; setting an operation mode of memory cells connected to the weak word line to a first operation mode and setting an operation mode of memory cells connected to the at least one spare word line to a second operation mode; receiving a write request from a host; and writing data to at least one of the memory cells connected to the weak word line and the memory cells connected to the at least one spare word line, based on the set operation mode, wherein memory cells connected to the plurality of normal word lines are set to a third operation mode configured to write (n+m)-bit data, and wherein the first operation mode is configured to write n-bit data to the memory cells connected to the weak word line, the second operation mode is configured to write m-bit data to the memory cells connected to the at least one spare word line, and each of n and m is a natural number greater than or equal to 1 and m is greater than n.

16. The method of claim 15, wherein the detecting of the at least one of the normal word lines as the weak word line comprises detecting a word line including at least a reference number of weak memory cells as the weak word line, wherein a weak memory cell is a memory cell that has failed a write operation or an erase operation, from among memory cells connected to the normal word lines.

17. The method of claim 15, wherein the setting of the operation mode of the memory cells connected to the spare word line to the second operation mode comprises storing first operation mode information and second operation mode information in at least one of a buffer memory of the memory controller and a meta region of the memory device.

18. The method of claim 15, wherein the writing of the data comprises writing the data to the memory cells connected to the weak word line in a single-level cell (SIC)

mode or writing the data to the memory cells connected to the spare word line in a multi-level cell (MLC) mode.

* * * * *